(12) United States Patent
Foote et al.

(10) Patent No.: US 6,874,363 B1
(45) Date of Patent: Apr. 5, 2005

(54) TRAPPED CHARGE FIELD BIAS VIBRATING BEAM ACCELEROMETER

(75) Inventors: Steven A. Foote, Issaquah, WA (US); Charles D. Skinner, Seattle, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/698,254

(22) Filed: Oct. 31, 2003

(51) Int. Cl.[7] .............................................. G01P 15/10
(52) U.S. Cl. .................... 73/514.29; 73/514.36
(58) Field of Search ......................... 73/514.29, 514.32, 73/514.36, 514.37, 862.59, 504.15, 504.16, 504.14

(56) References Cited

U.S. PATENT DOCUMENTS

| | | | |
|---|---|---|---|
| 3,702,073 A | 11/1972 | Jacobs | |
| 4,335,611 A | 6/1982 | Bennett et al. | |
| 4,495,815 A | 1/1985 | Stratton et al. | |
| 4,766,768 A | 8/1988 | Norling et al. | |
| 4,945,765 A | 8/1990 | Roszhart | |
| 5,006,487 A | 4/1991 | Stokes | |
| 5,228,341 A | 7/1993 | Tsuchitani et al. | |
| 5,343,064 A | 8/1994 | Spangler et al. | |
| 5,350,189 A | 9/1994 | Tsuchitani et al. | |
| 5,396,798 A | 3/1995 | Frische | |
| 5,948,981 A * | 9/1999 | Woodruff | 73/514.29 |
| 5,996,411 A * | 12/1999 | Leonardson et al. | 73/514.29 |
| 6,013,933 A | 1/2000 | Foerstner et al. | |
| 6,269,698 B1 * | 8/2001 | Woodruff | 73/514.29 |
| 6,453,744 B2 * | 9/2002 | Williams | 73/504.12 |
| 6,469,330 B1 | 10/2002 | Vigna et al. | |
| 6,484,578 B2 * | 11/2002 | Woodruff et al. | 73/514.29 |
| 6,541,369 B2 * | 4/2003 | Huang et al. | 438/624 |

* cited by examiner

Primary Examiner—Helen Kwok
(74) Attorney, Agent, or Firm—Charles J. Rupnick, Attorney at Law (57) ABSTRACT

A mechanical resonator having an electrical charge buried and substantially permanently trapped in a layer of insulating material grown or otherwise formed on either or both of the electrode and the vibratory beam, whereby the trapped electrical charge generates electrostatic forces between the beams and the electrodes of the opposing plates of the resultant capacitor.

20 Claims, 6 Drawing Sheets

TRAPPED CHARGE FIELD BIAS VIBRATING BEAM ACCELEROMETER

FIELD OF THE INVENTION

The present invention relates to micromachined accelerometer devices, and in particular to micro-machined accelerometers incorporating one or more vibrating force transducers for measuring the force applied to a proof mass and methods for manufacturing the same.

BACKGROUND OF THE INVENTION

Micromachined accelerometers are well-known in which a micromachined proof mass is suspended by a hinge or flexure from a fixed frame forming a part of the framework of the accelerometer. In resonator accelerometers one or more micromachined vibrating beams are mechanically tensioned between the proof mass and the frame, and the vibration of the beams is electrostatically excited by a tuned circuit comprising a moving-electrode capacitor, the position of the beams determines the position of the electrode. An electromotive force (voltage) applied to the capacitor by the tuned circuit tends to move the beam, and the movement of the beam changes the value of the capacitor of the tuned circuit; the feedback of the tuned circuit is such that mechanical and electrical resonance occurs at a natural vibration frequency of the beam. The resonance frequency, that is to say the frequency at which the beam naturally enters into self-sustained vibration, depends on the mechanical tension longitudinally exerted on it, as is the situation, for example, with a musical instrument string. This mechanical tension itself depends on the acceleration to which the proof mass exerting the tension is subjected. A frequency measurement in the resonant circuit therefore represents acceleration of the device.

The vibrating beam force sensors are driven electrostatically, with a relatively small drive signal superimposed on top of a relatively larger field bias voltage. Electronics external to accelerometer transduce capacitance changes to an amplified electrical output that is used to provide closed-loop oscillation drive voltages to the opposing plates of the capacitor.

Such a micro-accelerometer is therefore a combination of mechanical structure (proof mass, vibrating beam, other suspension arms, fixed framework) and electrical structure (capacitor electrodes, current-feed connections, and an external oscillator drive circuit).

One such accelerometer is disclosed in U.S. Pat. No. 6,484,578, entitled VIBRATING BEAM ACCELEROMETER, issued Nov. 26, 2002, the complete disclosure of which is incorporated herein by reference, was granted to one of the co-inventors of the present invention and owned by the same Assignee.

SUMMARY OF THE INVENTION

The present invention is a mechanical resonator that overcomes limitations of prior art devices by providing an electrical charge buried and substantially permanently trapped in a layer of insulating material grown or otherwise formed on either or both of the electrode and the vibratory beam, whereby the trapped electrical charge generates electrostatic forces between the beams and the electrodes and thereby eliminates the electrical circuit required in prior art devices to supply field bias voltages to the opposing plates of the capacitor.

Accordingly, the present invention provides a mechanical resonator having one or more elongate beams microstructurally formed of a semiconductor material; one or more corresponding electrodes microstructurally formed of the semiconductor material and positioned closely spaced from the beam; an insulator layer formed on a surface of one of the beam and the electrode; and an electrical charge buried in the insulator layer.

According to another aspect of the invention, the insulator layer in which the electrical charge is buried is formed on a surface of the electrode facing toward the beam. Alternatively, the insulator layer is formed on a surface of the beam facing toward the electrode. According to yet another aspect of the invention, the electrical charge is buried in insulator layers that are formed on opposing surfaces of both the beam and the electrode.

According to another aspect of the invention, the insulator layer in which the electrical charge is buried is selected from a group of insulator materials including both silicon dioxide and silicon nitride.

According to one aspect of the invention, the semiconductor material of which the beam and electrode are formed is an active layer of single-crystal semiconductor material that is epitaxially or otherwise grown or bonded on one surface of a substantially planar substrate. The mechanical resonator optionally includes a layer of sacrificial material between the substrate and the active layer.

According to another aspect of the invention, the mechanical resonator includes a plurality of beams and a corresponding plurality of electrodes. By example and without limitation the beams are each formed with a plurality of laterally projecting fingers; the electrodes are each formed with a plurality of laterally projecting fingers, and the beam and electrode fingers are mutually positioned to overlap and thereby intermesh.

According to another aspect of the invention, an electrostatically driven vibrating beam sensor is provided, the sensor including a proof mass suspended from a frame and one or more electrostatically driven mechanical resonators coupled between the proof mass and the frame, wherein each of the one or more mechanical resonators is formed of a semiconductor material as an elongate beam laterally spaced from a substantially parallel electrode such that opposing lateral surfaces of the beam and electrode form a substantially parallel-plate capacitor. An insulator layer, by example and without limitation either silicon dioxide or silicon nitride, is formed on a lateral surface of one or both of the beam and the electrode. An electrical charge is substantially permanently buried in the insulator layer. According to one aspect of the invention, the buried electrical charge generates an electrostatic field between the electrode and beam. An oscillator circuit electrically is coupled for driving each of the one or more mechanical resonators.

According to another aspect of the invention, the one or more mechanical resonators are formed in a single-crystal semiconductor material active layer that is epitaxially grown or otherwise formed or bonded on one surface of a substantially planar substrate in which the proof mass and frame are formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for manufacturing a vibrating beam sensor, and in particular for an electrostatically driven vibrating beam accelerometer sensor. The apparatus and method of the invention includes a mechanical resonator formed in a semiconductor material and having a frequency of vibration proportional to force applied thereto, wherein the mechanical resonator is formed of an elongate beam closely spaced from a substantially parallel electrode, at least one of either the electrode or the beam having an insulator layer formed on a surface thereof facing toward the other, and an electrical charge substantially permanently buried in the insulator layer, whereby the buried electrical charge generates an electrostatic field between the electrode and the beam. Optionally, the insulator layer is grown on a surface of either the electrode or the beam, or on spaced apart opposing surfaces of both the electrode and the beam.

According to one embodiment of the invention, the electrode and beam are formed having intermeshing comb-like fingers constituting a large quantity of substantially parallel-plate capacitors, wherein electrostatic forces are generated between the beams and the electrodes by electrical charge substantially permanently buried in insulator layers formed on opposing surfaces of either or both of the electrode and beam fingers.

According to one embodiment of the invention, the invention includes a mechanical resonator formed in an active layer of single-crystal semiconductor material grown or bonded on one surface of a substrate with a sacrificial material layer between the substrate and the active layer.

According to one embodiment of the invention, the one or more elongate beams are coupled between an instrument frame and a proof mass suspended by a flexure and both the beams and electrodes are connected to a suitable oscillator circuit for electrostatically vibrating the beams.

Figure 1:
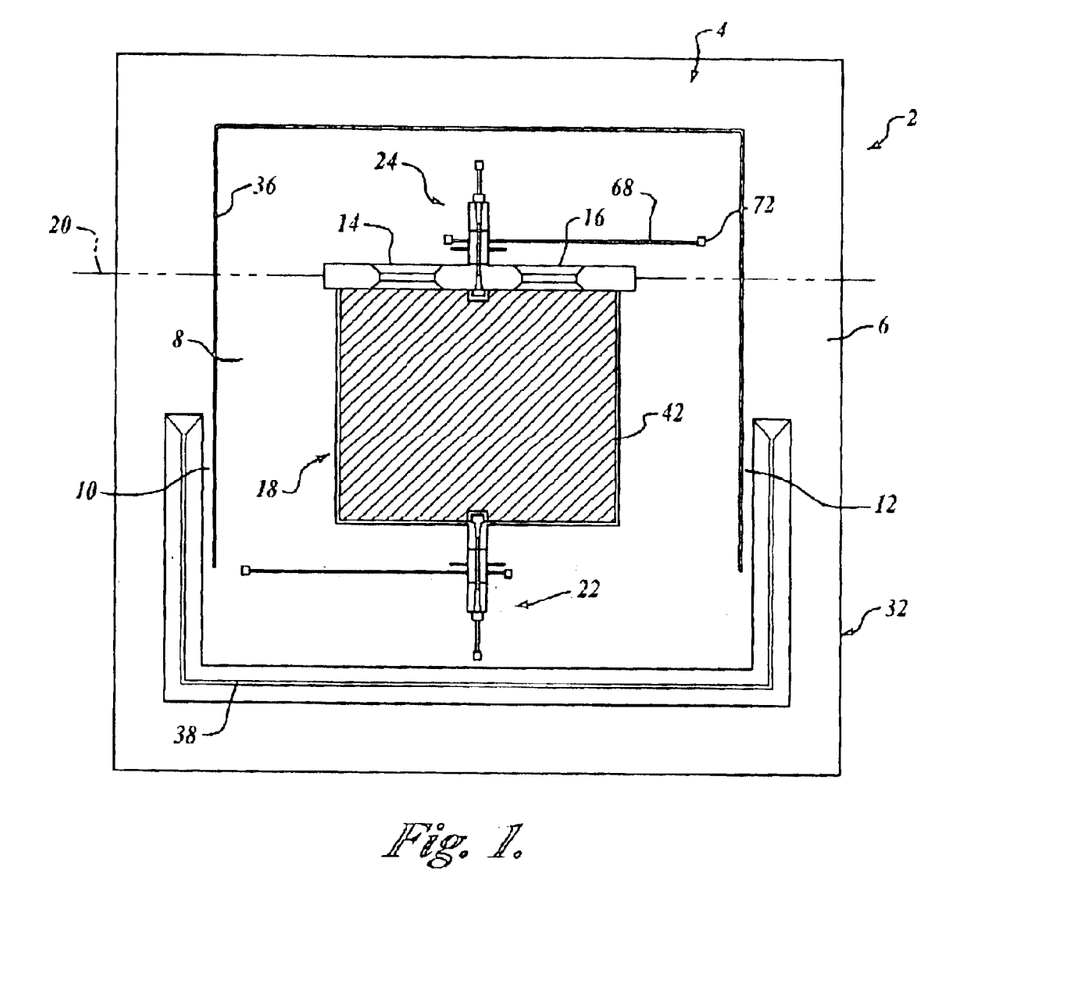
FIG. 1 is a schematic top view of a micro silicon accelerometer manufactured according to the principles of the present invention.
Figure 2:
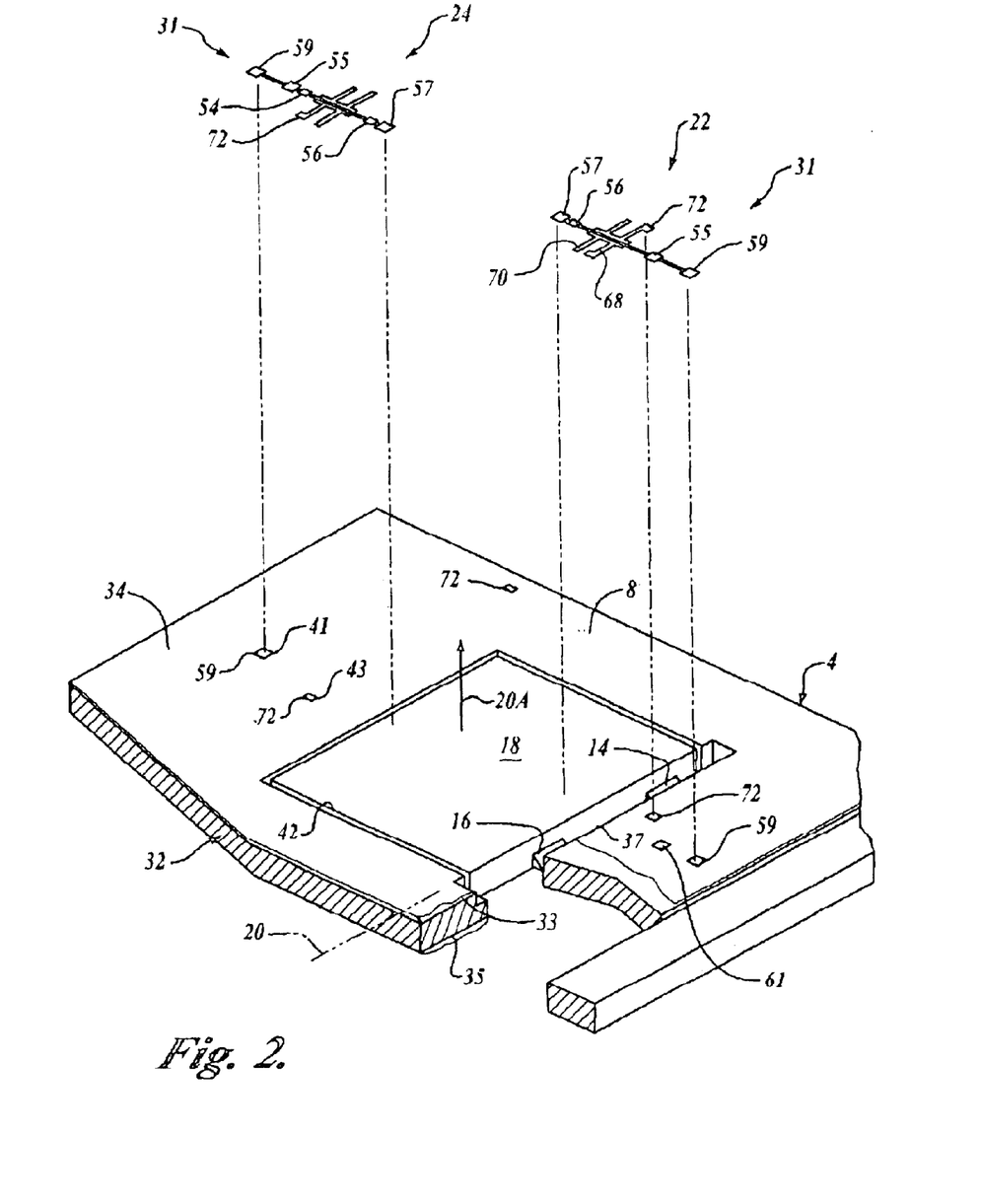
FIG. 2 is an exploded view of the accelerometer of FIG. 1.

FIGS. 1 and 2 outline typical features as practiced in a state-of-the-art vibrating beam accelerometer sensor. As discussed in above-incorporated U.S. Pat. No. 6,484,578, a well-known and widely used technique for force detection and measurement employs a mechanical resonator having a frequency of vibration proportional to the force applied. In one such mechanical resonator, one or more elongate beams are coupled between an instrument frame and a proof mass suspended by a flexure. An electrostatic force applied to the beams to causes them to vibrate transversely at a resonant frequency. The mechanical resonator is designed so that force applied to the proof mass along a fixed axis will cause tension or compression of the beams, which varies the frequency of the vibrating beams. The force applied to the proof mass is quantified by measuring the change in vibration frequency of the beams.

Vibratory force transducers are known that have been fabricated from a body of semiconductor material, such as silicon, using micromachining techniques. For example, one micromachining technique involves masking a body of silicon in a desired pattern, and then deep etching the silicon to remove unmasked portions thereof. The resulting three-dimensional silicon structure functions as a miniature mechanical resonator device, such as an accelerometer that includes a proof mass suspended by a flexure. Existing techniques for manufacturing these miniature devices are described in U.S. Pat. No. 5,006,487, "METHOD OF MAKING AN ELECTROSTATIC SILICON ACCELEROMETER," and U.S. Pat. No. 4,945,765 "SILICON MICROMACHINED ACCELEROMETER," the complete disclosures of which are incorporated herein by reference.

Pendulous accelerometers, for example, vibrating beam accelerometers, capacitive accelerometers, capacitive rebalance accelerometers, and translational mass accelerometers comprise a reaction mass. Existing design and manufacturing techniques for these devices are described in U.S. Pat. No. 4,495,815 "MASS AND COIL ARRANGEMENT FOR USE IN AN ACCELERATOR," U.S. Pat. No. 5,396,798 "MECHANICAL RESONANCE, SILICON ACCELEROMETER," U.S. Pat. No. 4,766,768 "ACCELEROMETER WITH ISOLATOR FOR COMMON MODE INPUTS," U.S. Pat. No. 5,228,341 "CAPACITIVE ACCELERATION DETECTOR HAVING REDUCED MASS PORTION," U.S. Pat. No. 5,350,189 "CAPACITANCE TYPE ACCELEROMETER FOR AIR BAG SYSTEM," U.S. Pat. No. 4,335,611 "ACCELEROMETER," and U.S. Pat. No. 3,702,073 "ACCELEROMETER," the complete disclosures of which are all incorporated herein by reference. All practical pendulous accelerometers to date function on the principle of Neuton's law that force equals mass times acceleration. In many accelerometer applications high performance and small size are desirable. One problem with the design of small, high performance pendulous accelerometer sensors involves obtaining adequate reaction mass in a small space. A second problem with the design of small, high performance pendulous accelerometer sensors involves providing adequate isolation from the mounting structure such that mounting strains do not affect accelerometer performance. Typical accelerometer sensors include a pendulous reaction mass, often referred to as a proof mass, suspended from a stationary frame by, for example, a flexural suspension member of some other form of pivot mechanism. This pivot constrains the reaction mass to only one direction of motion, the reaction mass is free to move along this one direction of motion unless restrained to the null position. The pendulous reaction mass must be restrained under acceleration by an opposing force which may be the result of a position feedback circuit. Alternatively, the accelerometer may be an open-loop device in which the opposing force may be supplied a spring in the form of, for example, pivot stiffness.

In a typical accelerometer sensor mechanism the pendulous reaction mass is suspended on a flexural suspension member inside an external support frame. Isolation is typically provided by mounting the supporting frame itself inside an isolation feature supported from a final exterior frame which provides mounting both to sensor covers and to the accelerometer housing. The large exterior frame system is static and adds no mass to the active reaction mass. Additionally, any external strain-couples through the exterior frame system directly across the length of the sensor mechanism. The resultant large frame dimensions tend to maximize the effect of error drivers, for example, thermal expansion mismatch, placing additional burden on the isolator function.

In FIG. 1 a representative force detecting system or accelerometer 2 is a miniature structure fabricated from a body of semiconductor material by micro-machining techniques. By example and without limitation accelerometer 2 is formed from a body 4, such as monocrystalline silicon, that includes a pair of inner flexures 14, 16 supporting a proof mass 18 for movement about a hinge axis 20 parallel to the plane of body 4. Proof mass 18 will move about hinge axis 20 in response to an applied force, such as the acceleration of the vehicle, aircraft or the like that carries accelerometer 2. Accelerometer 2 includes an exemplary pair of vibratory force transducers 22, 24 coupled between proof mass 18 and to body 4 for measuring forces applied to proof mass 18. An oscillator circuit 30 (shown in FIG. 6) electrostatically drives transducers 22, 24 at their resonance frequency. Proof mass 18 will rotate about hinge axis 20 in response to a component of force applied along an input axis I, shown in FIG. 2. Rotation of proof mass 18 causes respective compressive and tensile axial forces to be applied to transducers 22, 24. The axial forces change the frequency of vibration of transducers 22, 24 and the magnitude of this change serves as a measure of the applied force.

FIG. 2 schematically illustrates body 4 having an upper silicon or active layer 31 electrically isolated from an underlying substrate 32 by an insulating layer 34 applied to substrate 32. Insulating layer 34 is a thin layer, e.g., about 0.1 to 10.0 micrometers, of oxide, such as silicon oxide. The silicon body 4 may be formed by oxidizing active layer 31 and substrate 32, and then adhering the two layers together. A portion of active layer 31 is removed to bring layer 31 to the desired thickness. The silicon oxide layer 34 retains its insulating properties over a wide temperature range to ensure effective transducer performance at, for example, high operating temperatures on the order of above about 70 to 100 degrees C. In addition, the insulating layer 34 inhibits undesirable etching of the active layer while the substrate is being etched.

As shown in FIG. 2, proof mass 18 is formed from substrate 32 by etching a slot 42 through substrate and suitably etching around inner flexures 14, 16. Transducer 22 and 24 and appropriate electrical bonds 59, 72 for coupling transducer 22 to oscillator circuit 30 are formed on active layer 31 by suitable etching techniques, such as reactive ion etching, anisotropic etching or the like. Preferably, electrical bonds 59, 72 are directly coupled to oscillator circuit 30. If desired, the remaining portions (not shown) of active layer 31 may then be removed to minimize disturbances to the active components.

As shown in FIG. 2, inner flexures 14, 16 are etched near or at the center of the silicon substrate 32 so that they are substantially centered between upper and lower surfaces 33, 35. Flexures 14, 16 may be formed by anistropically etching in a suitable etchant, such as potassium hydroxide. This arrangement causes input axis I to be substantially normal to the plane of substrate 32, which reduces the skew of the input axis I relative to the mass of the proof mass 18. Flexures 14, 16 are spaced from each other and define an effective hinge point 37 substantially centered therebetween. Alternatively, a single flexure may be formed at hinge point 37. Flexures 14, 16 are relatively short to limit S-bending.

In FIG. 1 outer and inner frames 6, 8 are formed on substrate 32 by etching slots 36, 38 through substrate 32. Slots 36, 38 overlap each other to form flexures 10, 12 so that inner and outer frames 6, 8 are movable relative to each other. Outer frame 6 is usually coupled to a silicon cover plate 7 (shown in FIG. 8), which, in turn, is typically connected to a ceramic or metal mounting plate 9 (shown in FIG. 8). Since the mounting and cover plates are fabricated from different materials, they will usually have substantially different coefficients of thermal expansion when heated. This thermal mismatching may cause undesirable stresses and strains at the interface of the inner and cover plates, causing a slight distortion of outer frame 6. Flexures 10, 12 allow inner frame 8 to move relative to outer frame 6 to minimize the distortion of inner frame 8 and thereby decrease the effects of thermal mismatching on transducers 22, 24.

Figure 3:
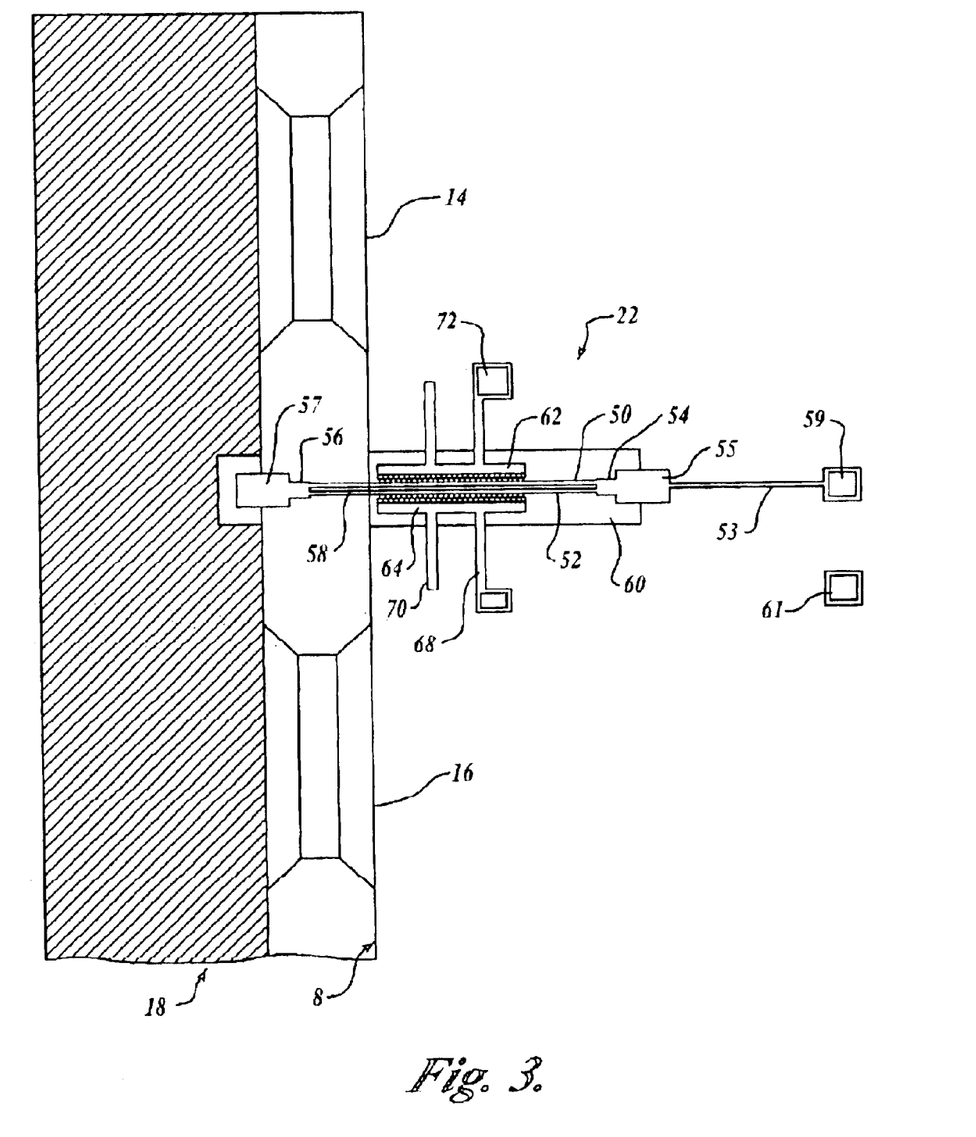
FIG. 3 is an enlarged view of a portion of the accelerometer of FIG. 1, illustrating an exemplary vibratory force transducer.
Figure 4:
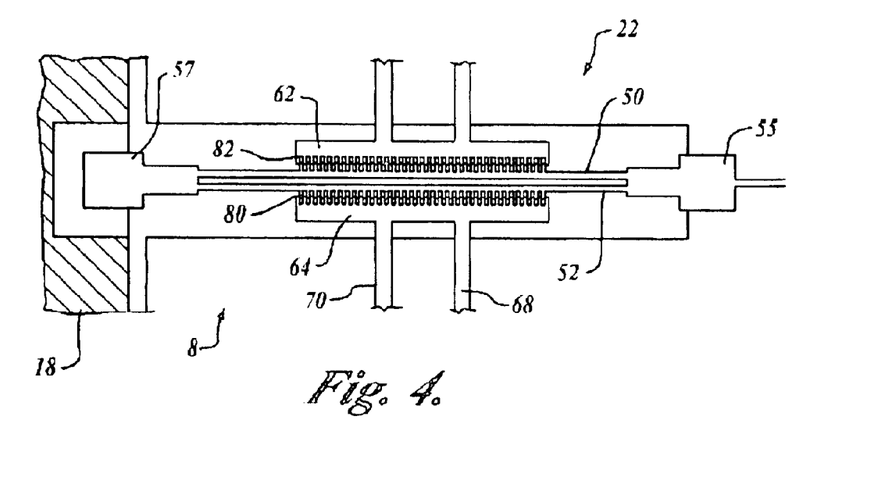
FIG. 4 is an enlarged view of the vibratory force transducer of FIG. 3.
Figure 5:
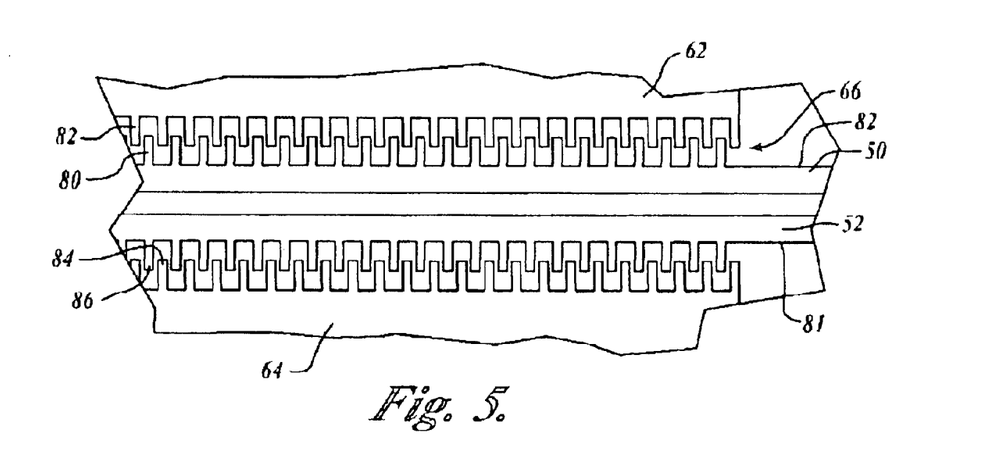
FIG. 5 is a further enlarged view of the vibratory force transducer, illustrating the intermeshed projecting fingers of the present invention.

FIGS. 3, 4 and 5 illustrate an exemplary embodiment of one of the vibratory transducers 22 in detail. Vibratory transducer 22 includes a pair of generally parallel beams 50, 52 coupled together at enlarged or widened end portions 54, 56 and separated from each other by a slot 58 to form a double ended tuning fork. Beams 50, 52 are formed from active silicon layer 31 and separated from substrate 32 so that the beams may be vibrated laterally relative to fixed end portions 54, 56. End portions 54, 56 are suitably bonded to proof mass 18 and body 4, respectively, by mounting pads 55, 57. Widened end portions 54, 56 mechanically couple the vibrating beams 50, 52 to each other. Slot 58 is typically formed having a width of about 10 to 30 microns and a length of about 1000 to 2000 microns. However, it will be understood that these dimensions may vary depending on the design.

Of course, it should be recognized that the present invention is not limited to the double ended tuning fork described above and shown in FIGS. 3, 4 and 5. For example, accelerometer 2 may incorporate a single beam or a variety of other mechanical resonator arrangements. However, a double ended tuning fork arrangement permits beams 50, 52 to be driven laterally in opposite directions relative to each other. Driving beams 50, 52 in opposite directions increases the effectiveness of the transducer by minimizing transfer of energy from the moving beams to other components in accelerometer 2.

Transducers 22, 24 each further include an electrostatic drive for laterally vibrating beams 50, 52 at the resonance frequency. The electrostatic drive includes a pair of elongate electrodes 62, 64 located on either side of beams 50, 52, respectively. Electrodes 62, 64 are substantially parallel to and laterally spaced from beams 50, 52 by a gap 66, as better illustrated in FIG. 5. Electrodes 62, 64 are etched from active layer 31 and doped with a suitable conductive material to create the necessary charge carriers and to facilitate completion of the electrical circuit. Alternatively, electrodes 62, 64 may be formed from an electrically conductive material, such as gold, that is bonded to active layer 31.

As shown in FIGS. 1 and 3, each electrode 62, 64 is supported by a pair of support arms 68, 70 extending laterally away from beams. One of the support arms 68 on each electrode 62, 64 is coupled to a bonding pad 72 for electrically coupling electrodes 62, 64 to oscillation circuit 30, as illustrated in FIG. 3. Mounting pad 55 is coupled to an arm 53 that electrically couples beams 50, 52 to a bonding pad 59. Bonding pad 59 is suitably coupled to oscillation circuit 30 to complete the electrical circuit with electrodes 62, 64 and beams 50, 52. As shown in FIG. 2, substrate 32 may also include a bonding pad 61 for electrically connecting substrate 32 to ground. Bonding pads 59, 61 and 72 are formed from a suitable conductive material, such as gold.

FIGS. 4 and 5 illustrate an embodiment in which beams 50, 52 each include a plurality of fingers 80, 86 projecting outward from a lateral surface 82, 84 of each beam 50, 52 toward the corresponding electrode 62, 64. Likewise, electrodes 62, 64 each include a plurality of fingers 82, 84 projecting laterally inward so that beam fingers 80, 86 and electrode fingers 82, 84 are intermeshed with each other. Fingers 80, 82 are each sized so that their ends 84 will not contact beams 50, 52 or electrodes 62, 64 when beams 50, 52 are laterally vibrated relative to electrodes 62, 64. Usually, fingers 80, 82 will have a length of about 20 to 60 microns and preferably about 35 to 45 microns so that fingers 80, 82 overlap each other in the lateral direction by about 2 to 10 microns. Electrode fingers 82 and beam fingers 80 are axially spaced from each other by a suitable distance to provide electric capacitance therebetween, whereby the electrode fingers 82 and beam fingers 80 constitute substantially parallel-plate capacitors. Usually, electrode and beam fingers 82, 80 are spaced by about 2 to 10 microns from each other and preferably about 4 to 8 microns. Since beam fingers 80 are axially spaced from electrode fingers 82, the distance between these fingers generally remains constant as beams 50, 52 vibrate in the lateral direction.

Electrostatic force between the beams and the electrodes is generally proportional to the change in capacitance with distance. Since the capacitance between the respective intermeshed electrode fingers 82, 84 and beam fingers 80, 86 changes approximately linearly with the motion of the beams, the electrostatic force will remain substantially constant as the beams move toward and away from the electrodes. Accordingly, the electrostatic force remains substantially constant during vibration of beams 50, 52 and, therefore, does not work against the mechanical spring of the beams 50, 52 to lower the resonance frequency. Thus, the sensitivity to changes in bias voltage is decreased by the intermeshed electrode and beam fingers.

Figure 6:
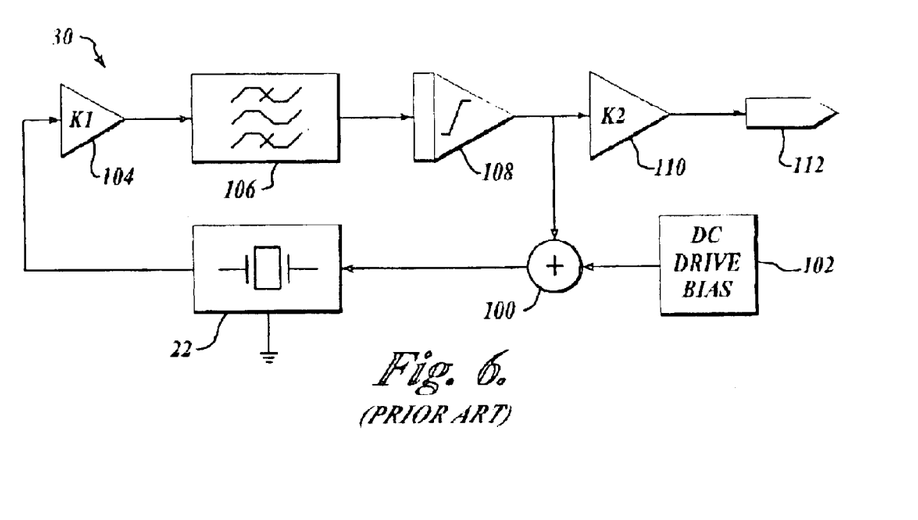
FIG. 6 is a block diagram of an electrical circuit for driving the transducer of FIG. 3 when constructed according to the prior art.

FIG. 6 illustrates a representative oscillation circuit 30 in which vibrating beams 50, 52 of transducers 22, 24 function as a resonator. A transimpedance amplifier 104 converts a sense current received from vibrating beams 50, 52 to a voltage. This voltage is filtered by a bandpass filter 106, which reduces noise, and its amplitude is controlled by an amplitude limiter 108. The resulting signal is combined with the output or DC bias voltage from a DC source 102 in a summing junction 100. The DC bias voltage generates a force between electrodes 62, 64 and beams 50, 52. This force is modulated by the oscillatory signal from the amplitude limiter 108, causing beams 50, 52 to vibrate laterally at their resonant frequency. The magnitude of the oscillatory force component increases proportionally with the DC bias voltage. Thus, the DC bias voltage must be-large enough to drive the motion of the beams 50, 52. The DC bias voltage must typically be very large, on the order of 100 to 200 volts according to one prior art device, to generate sufficient field strength between the electrodes 62, 64 and beams 50, 52 to drive the beams hard enough to generate the vibratory motion. This lateral beam motion, in turn, generates the sense current. An output buffer 110 isolates the oscillator from external circuitry connected to an output 112 of oscillation circuit 30. The gain in oscillation circuit 30 sustains oscillation of beams 50, 52.

Intermeshing of electrode fingers 82, 84 and beam fingers 80, 86 is known to reduce sensitivity to changes in bias voltage by 5 to 10 times compared to a similar resonator that does not incorporate intermeshed fingers. Reducing sensitivity of the resonance frequency to changes in bias voltage increases the accuracy of the vibratory force transducer. In addition, this allows the transducer to effectively operate with higher bias voltage levels, which results in a larger signal-to-noise ratio and requires less amplifier gain in the oscillator circuit. Usually, a bias voltage of about 100 to 200 Volts will be applied to electrodes 62, 64 and beams 50, 52 and preferably at least 50 Volts will be applied to the electrodes and beams. However, the electrodes 62, 64 and beams 50, 52 are embodied only by example and without limitation as having intermeshed electrode fingers 82, 84 and beam fingers 80, 86. The present invention is applicable to any configuration of vibratory force transducer wherein the vibration of the beams is electrostatically excited with a relatively small drive signal superimposed on top of a relatively larger field bias voltage, as discussed herein.

According to the exemplary arrangement embodied in FIGS. 3 through 5, the vibrating beams 50, 52 are generally opposed to drive electrodes 62, 64 such that an electrostatic field between the two will attract or repel the beam, depending on the polarity of the applied voltage. Electrostatic force is generally proportional to the square of the charge, which is proportional to the voltage and to the capacitance between the beam and the electrode.

For non-fingered flat plate electrodes, the capacitance is inversely proportional to the distance between the beam and the electrode. Accordingly, the electrostatic force is proportional to the square of the voltage and inversely proportional to the square of the distance between the beam and the electrode. The force generated by the applied voltage is approximated as:

$$F = k\frac{V^2}{X^2}$$

where:

k is a constant determined by the electrode geometry;

V is the voltage impressed across the beam to electrode gap; and

X is the distance across the gap.

If a voltage, $V = V_B + V_S \mathrm{Sin}(\omega t)$ is applied then the force is proportional to the voltage squared as given by:

$$F = V_B^2 + 2V_B V_S \mathrm{Sin}(\omega t) + V_S \mathrm{Sin}(\omega t)$$

where:

$V_B$ is the applied field bias voltage; and $V_S$ is the oscillation drive signal.

In general, $V_B >> V_S$ such that $V_S \mathrm{Sin}(\omega t)$ is small. Thus, the force comprises a constant, $V_B^2$ plus the desired oscillation signal; $2V_B V_S \mathrm{Sin}(\omega t)$. Thus, the drive force is proportional to the applied field bias voltage as well as to the drive signal. In a generally linear system, beam displacement will be proportional to the applied force.

Similarly, the sense signal provided to the input amplifier of a typical feedback oscillator circuit depends on the field bias voltage according to:

$$\text{Sense\_current} \Box \frac{V_B * C * AX}{X}$$

where:

C is the gap capacitance;

X is the distance between the electrode and the vibrating beam;

AX is the displacement of the vibrating beam.

Thus, both the beam driving force and the sensed current depend on the magnitude of the field bias voltage and the overall signal throughput is generally proportional to the square of the bias voltage. This makes a high applied field bias voltage $V_B$ a prerequisite for design of a high sensitivity, low noise system. The requirement creates a design contention between low cost, low voltage power on one hand, and adequate drive and signal on the other hand. Aside from operation in a vacuum to eliminate viscous drag and raise the amplification factor Q, current devices are not able to operate without a costly high voltage bias supply.

Complexity of the circuitry required to supply the field bias voltage adds cost and the bias voltage regulation circuits required real estate thus adding to the device size. Furthermore, the oscillator drive circuitry suffers power dissipation and leakage currents from the high voltage bias supply drive accelerometer noise. The necessity to supply high voltage for a field bias is thus a major impediment to the application of electrostatically driven vibrating beam accelerometers.

The present invention provides a trapped electrical charge buried in an insulator layer grown on one or both of the opposing surfaces of the electrode and beam to achieve the result of a field bias without the expense or system complexity associated with a special, high voltage bias supply. The trapped electrical charge of the invention eliminates the cost, power dissipation, and real-estate requirements of the bias voltage regulation circuits currently employed in vibratory force transducers of the type described herein. The use of trapped buried charge permits use of relatively simplified oscillator drive circuitry. Also, accelerometer noise driven by leakage currents from the high voltage bias supply is eliminated.

The trapped charge of the invention eliminates the requirement of the prior art to supply a field bias voltage because the trapped charge accomplishes the same result. Such a "trapped" or permanent electrical charge is commonly used in well-known electret-type microphones and memory devices. In silicon devices, the electrical charge is buried and substantially permanently trapped within a silicon dioxide, silicon nitride, or other insulator. The buried trapped charge produces the static field currently generated by the bias voltage in prior art devices. The electrical charge is substantially permanently trapped inside an insulating layer grown on the surface of the electrodes opposite the beam surface, on the surface of the beams opposite the electrode surface, or on both opposing electrode and beam surfaces.

Figure 7:
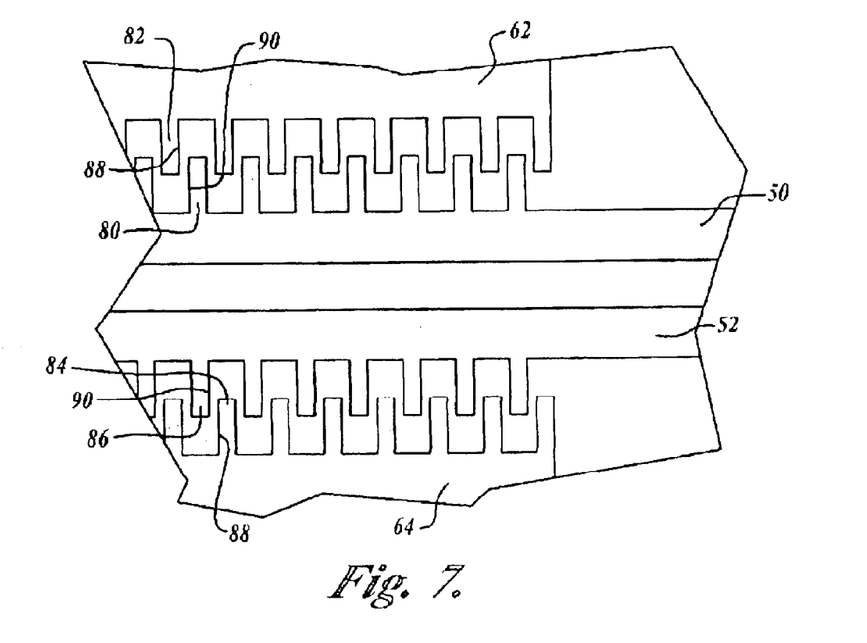
FIG. 7 illustrates one embodiment of the invention practiced in a vibratory force transducer of the type described herein, wherein an electrical charge is substantially permanently trapped inside an insulating layer grown on the surface of one or both of the electrode and the beam.

FIG. 7 illustrates one embodiment of the invention practiced in a vibratory force transducer of the type described herein and illustrated in the Figures wherein the electrical charge is substantially permanently trapped inside an insulating layer 88 grown on the surface of the electrode fingers 82, 84; an insulating layer 90 grown on the opposing surface of the beam fingers 80, 86; or inside insulating layers 88 and 90 grown on opposing surfaces of both electrode and beam fingers, as shown.

However, according to one embodiment of the invention described herein, the electrical charge is only trapped inside the insulating layer 88 grown on the surface of the electrodes 62, 64 which accommodates mechanical stability considerations discussed herein.

The electric charge is supplied, by example and without limitation, either by trapping excess electrons in one or both of the insulating layers 88, 90 during formation, or by injecting the excess electrons into one or both of the insulating layers 88, 90 after formation. Either process satisfies the goal of providing a substantially permanently trapped electrical charge in the insulating oxide layers, and both processes are commercial processes well-known to those of ordinary skill in the art.

The trapped electrical charge establishes an intense static field directly in the area of interest. Thus, the trapped electrical charge (q) effectively replaces the applied field bias voltage $V_B$ in the equations above using the value of substitute standing field bias voltage $V'_B$ is given by:

$$V'_B = \frac{q}{C}$$

Both the modulated force on the beam and the sense current are thus generated without the external voltage supply, in contrast to prior art devices. As a result, the external voltage supply is eliminated, the internal supply regulator is also eliminated, and the power dissipation associated with these electronics is eliminated. Additionally, the isolation circuitry is eliminated that was required in the signal path of prior art devices to prevent the drive circuitry from shorting out the high voltage bias supply. Since this previously required isolation capacitor can add phase shift around the closed loop oscillator circuit, its contribution to measurement error is eliminated as well.

According to the invention, the trapped electrical charge generating the static field is completely enclosed in an insulator, i.e., either or both insulating layers 88 and 90 grown on opposing surfaces of both electrode fingers 82, 84 and beam fingers 80, 86. Enclosing the electrical charge inside the insulating layers 88, 90 eliminates leakage paths at conductor edges. Expensive processing steps required in prior art devices to control these leakages may be eliminated. Yield losses related to these conductor edge leakages is eliminated at great savings.

Figure 8:
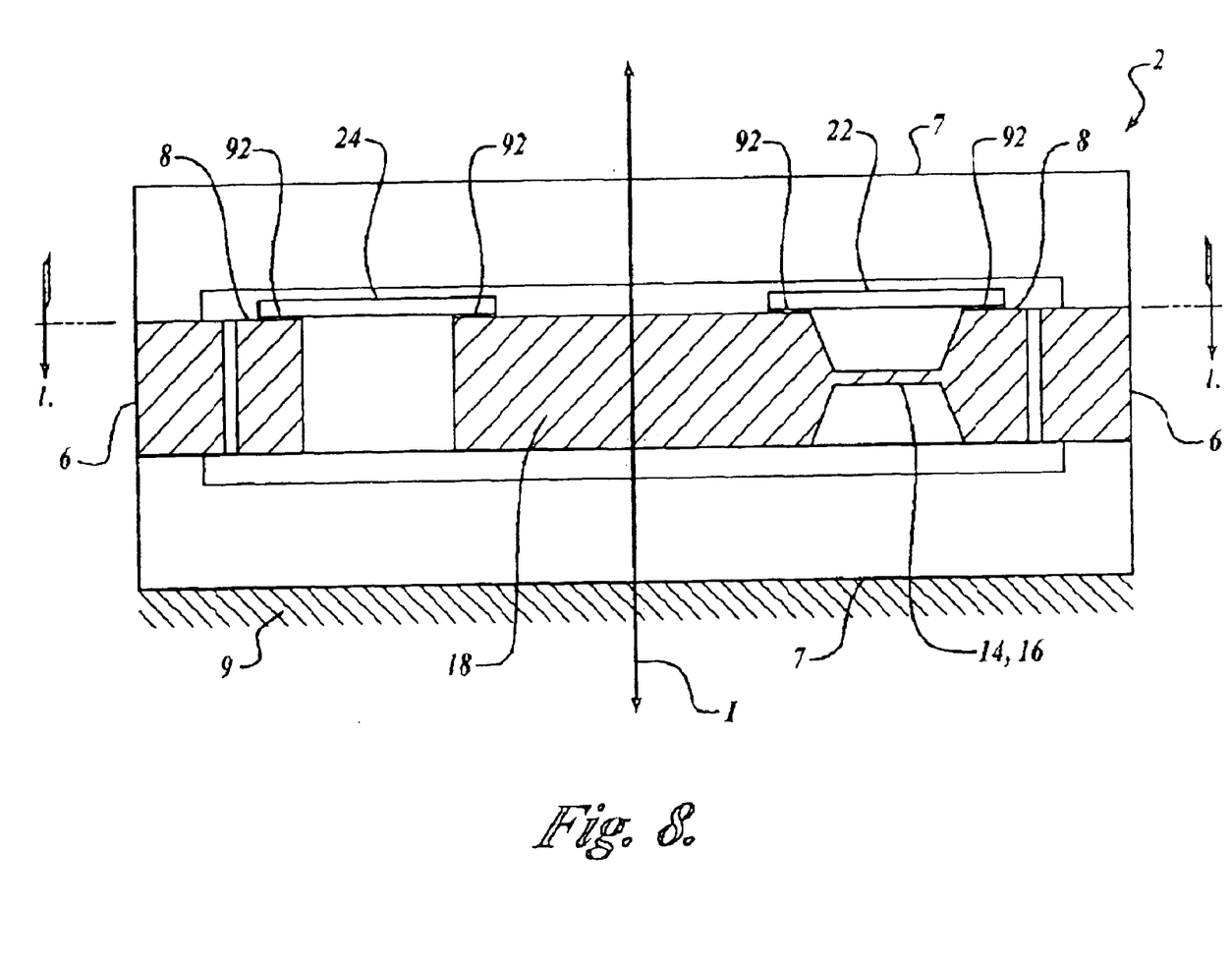
FIG. 8 is a side view that illustrates the invention practiced in a vibratory force transducer of the type described herein.

FIG. 8 is a side view of the device that illustrates the invention fabricated using well-known SOI technology.

However replacing the high voltage bias with the trapped electrical charge substantially alleviates the necessity for expensive Silicon-On-Insulator (SOI) technology. SOI was required in prior art devices to control the magnitude of high voltage leakage currents over the extended operating temperature range of practical instruments. Leakage currents produce noise in the system, as well as power dissipation that limits performance. Prior art attempts to eliminate SOI technology employed junction isolation in an epitaxial layer construction to provide isolation. But, increasing junction leakage at elevated temperatures defeated such epitaxial layer-based approaches and drove prior art device development to the higher cost SOI technology. With the elimination of leakage currents associated with the high voltage bias of the prior art, related noise is also eliminated which improves performance and permits accelerometer devices to be produced with much more cost efficient epitaxial layer technology.

SOI technology also suffers from other limitations. For example, SOI fabrication of devices causes an additional oxide layer discontinuity 92 to be formed under the anchor or mounting pads 55, 57 at the ends of the force sensors, i.e., vibratory force transducers 22, 24, between the ends of the force sensors and the inner frame 8 and proof mass 18. As seen in FIG. 8, this discontinuity is directly in the mechanical suspension path of the force sensor where it can be a major source of thermal error and long term drift. Since oxide thermal expansion is substantially lower than that of the silicon it bonds to, significant tensile stresses are inherent in the oxide layer. Glass is not strong in tension so it may be expected to crack and creep over time and temperature exposure. This will directly produce undesirable bias errors in the accelerometer output that can not be satisfactorily modeled.

Accordingly, the invention is optionally practiced using the so-called SOI (Silicon-on-Insulator) substrate formed by two silicon substrates separated by an insulating material layer (such as silicon oxide).

According to another embodiment of the invention, the exemplary accelerometer device of the invention being fabricated using an epitaxial layer or "EPI" process that renders a virtually mechanically homogeneous sensor construction. The undesirable bias errors in the accelerometer output that are present in construction using SOI fabrication technology are eliminated by practicing the present invention using the EPI process.

Methods are well-known for manufacturing microstructural devices in single-crystal semiconductor material epitaxially grown on substrate surfaces. See, for example, U.S. Pat. No. 6,013,933, "SEMICONDUCTOR STRUCTURE HAVING A MONOCRYSTALLINE MEMBER OVERLYING A CAVITY IN A SEMICONDUCTOR SUBSTRATE AND PROCESS THEREFORE", U.S. Pat. No. 6,469,330 "PROCESS FOR MANUFACTURING INTEGRATED DEVICES COMPRISING MICROSTRUCTURES AND ASSOCIATED SUSPENDED ELECTRICAL INTERCONNECTIONS," and U.S. Pat. No. 5,343,064 "FULLY INTEGRATED SINGLE-CRYSTAL SILICON-ON-INSULATOR PROCESS, SENSORS AND CIRCUITS," the complete disclosures of which are all incorporated herein by reference.

According to one embodiment of the invention, a thin layer, on the order of about 20 micrometers thick, of epitaxially grown single-crystal semiconductor material is grown on one surface of the substrate 32 with a sacrificial material layer, typically of silicon oxide, between substrate 32 and the epitaxial layer. According to one embodiment of the invention, as described by Vigna, et al. in U.S. Pat. No. 6,469,330 "PROCESS FOR MANUFACTURING INTEGRATED DEVICES COMPRISING MICROSTRUCTURES AND ASSOCIATED SUSPENDED ELECTRICAL INTERCONNECTIONS," which is incorporate herein by reference, a composite mobile ion barrier film, which includes a layer of silicon nitride and is bonded between the epitaxial layer and the substrate 32, may be used to prevent tramp alkali from the glass substrate from contaminating the silicon epitaxial layer.

Thereafter, using well-known epitaxial patterning techniques, the epitaxial layer is patterned into the vibratory force transducers 22, 24. This patterning step also exposes bond pads, allowing external connections to be readily made to the sensors and circuits. See, for example, U.S. Pat. No. 6,013,933, U.S. Pat. No. 6,469,330 and U.S. Pat. No. 5,343,064 which are incorporate herein by reference.

For example, the epitaxial layer is etched, preferably by reactive ion etching in a suitable plasma, to form the vibrating components of one or more of vibratory force transducers 22, 24 (i.e., vibrating beams 50, 52 and electrodes 62, 64). The opposite surface of the substrate 32 is etched to form proof mass 18 suspended from inner stationary frame 6 by one or more flexure hinge(s) 14, 16. While the opposite surface of the substrate is being etched, the epitaxial layer is typically held at an electric potential to prevent undesirable etching of the epitaxial layer.

As described above, the electrical charge is substantially permanently trapped inside the insulating layer 88 grown on the surface of the fingers 82, 84 of electrodes 62, 64, which accommodates mechanical stability considerations discussed herein. However, according to other embodiments of the invention, the electrical charge is substantially permanently trapped inside the insulating layer 90 grown on the opposing surface of the beam fingers 80, 86; or alternatively, inside both insulating layers 88 and 90, as shown.

During operation of the transducer, the beams 50, 52 and the electrodes 62, 64 are electrically isolated from the substrate by back biasing a diode junction between the epitaxial layer and the substrate 32. The transducer may then be coupled to a suitable electrical circuit to provide the electrical signals required for operation. In silicon vibrating beam accelerometers, for example, the beams are capacitively coupled to the electrodes, and then both the beams and electrodes are connected to a suitable oscillator circuit for electrostatically vibrating the beams. As is well-known in the prior art, the magnitude of a force applied to the proof mass is determined as a function of changes in the vibration frequency of the beams.

While the preferred embodiment of the invention has been illustrated and described, it will be appreciated that various changes can be made therein without departing from the spirit and scope of the invention.

Furthermore, while the foregoing invention has been described in detail for purposes of clarity, it will be obvious that certain modifications may be practiced within the scope of the appended claims. For example, although the present invention is particularly useful for electrostatically driven resonators, it may also be used with other drive means, such as piezoelectric drives, electromagnetic drives, thermal drives or the like.

What is claimed is:

1. A mechanical resonator comprising:
   a beam formed of a semiconductor material;
   an electrode formed of the semiconductor material and is closely spaced from the beam;
   an insulator layer formed on a surface of one of the beam and the electrode; and
   an electrical charge buried in the insulator layer.

2. The mechanical resonator of claim 1 wherein the semiconductor material of which the beam and the electrode are formed further comprises a layer provided on a surface of a substrate wherein the layer is one of an epitaxial layer and an active layer.

3. The mechanical resonator of claim 2, further comprising a layer of sacrificial material between the substrate and the surface layer.

4. The mechanical resonator of claim 1 wherein the insulator layer further comprises an insulator layer formed on a surface of the electrode facing toward the beam.

5. The mechanical resonator of claim 1 wherein the insulator layer further comprises an insulator material selected from the group comprising silicon dioxide and silicon nitride.

6. The mechanical resonator of claim 1 further comprising a plurality of beams and a corresponding plurality of electrodes.

7. The mechanical resonator of claim 1 wherein:
   the beam further comprises a plurality of laterally projecting fingers;

the electrode further comprises a plurality of laterally projecting fingers; and the beam and electrode fingers intermesh.

8. An electrostatically drivable mechanical resonator comprising:

one or more elongate beams microstructurally formed in a semiconductor material;

an electrode microstructurally formed in the semiconductor material and laterally spaced apart from the beam in substantially parallel manner, the electrode including a surface facing toward a corresponding surface of the beam;

an insulator layer grown on at least one of the electrode surface and the beam surface; and a substantially permanent electrical charge buried in the insulator layer.

9. The mechanical resonator of claim 8 wherein the insulator layer is grown on the electrode surface.

10. The mechanical resonator of claim 8 wherein the insulator layer further comprises one of a silicon dioxide and silicon nitride.

11. The mechanical resonator of claim 8 wherein the semiconductor material in which the beam and the electrode are formed further comprises a single-crystal semiconductor material that is provided on one surface of a substantially planar substrate.

12. The mechanical resonator of claim 8 wherein the beam and the electrode further comprise respective pluralities of laterally projecting and intermeshing fingers.

13. An electrostatically driven vibrating beam sensor comprising:

a proof mass suspended from a frame;

one or more electrostatically driven mechanical resonators coupled between the proof mass and the frame, the one or more mechanical resonators being formed of a semiconductor material as an elongate beam laterally spaced from a substantially parallel electrode wherein opposing lateral surfaces of the beam and the electrode form a substantially parallel-plate capacitor;

an insulator layer formed on one of the beam and the electrode lateral surfaces; and an electrical charge buried in the insulator layer.

14. The sensor of claim 13 wherein the buried electrical charge generates an electrostatic field between the electrode and the beam.

15. The sensor of claim 13 wherein the insulator layer further comprises an insulator material selected from the group of insulator materials comprising: silicon dioxide and silicon nitride.

16. The sensor of claim 13 wherein the one or more mechanical resonators are formed in a single-crystal semiconductor material that is coupled to one surface of a substantially planar substrate in which the proof mass and the frame are formed.

17. The sensor of claim 13 wherein the insulator layer is grown on the electrode surface.

18. The sensor of claim 13 wherein the insulator layer is grown on the beam surface.

19. The sensor of claim 13 wherein the one or more mechanical resonators is formed having a frequency of vibration proportional to a force applied thereto.

20. The sensor of claim 13, further comprising an oscillator circuit electrically coupled for driving the one or more mechanical resonators.

* * * * *